United States Patent
Kurapov (10) Patent No.: US 8,529,735 B2
(45) Date of Patent: Sep. 10, 2013

(54) NON GAMMA-PHASE CUBIC ALCRO (75) Inventor: Denis Kurapov, Walenstadt (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 179 days.

(21) Appl. No.: 13/123,056

(22) PCT Filed: Oct. 5, 2009

(86) PCT No.: PCT/EP2009/007118
§ 371 (c)(1),
(2), (4) Date: Apr. 7, 2011

(87) PCT Pub. No.: WO2010/040494
PCT Pub. Date: Apr. 15, 2010

(65) Prior Publication Data
US 2011/0195261 A1  Aug. 11, 2011

Related U.S. Application Data (60) Provisional application No. 61/104,293, filed on Oct. 10, 2008.

(51) Int. Cl.
*C23C 30/00* (2006.01)
(52) U.S. Cl.
USPC ............. 204/192.12; 204/192.15; 204/192.16
(58) Field of Classification Search
USPC .................. 51/307, 309; 428/697, 698, 699, 428/701, 702; 204/192.12, 192.15, 192.16
See application file for complete search history.

(56) References Cited

U.S. PATENT DOCUMENTS

| | | | |
|---|---|---|---|
| 5,310,607 A | 5/1994 | Schulz et al. | |
| 6,767,627 B2 * | 7/2004 | Morikawa et al. | 428/702 |
| 7,166,155 B2 * | 1/2007 | Ishikawa | 428/699 |
| 7,226,670 B2 * | 6/2007 | Derflinger et al. | 428/697 |
| 7,939,181 B2 * | 5/2011 | Ramm et al. | 428/701 |
| 2004/0137281 A1 | 7/2004 | Ishikawa | |
| 2005/0003239 A1 | 1/2005 | Derflinger et al. | |
| 2008/0090099 A1 | 4/2008 | Ramm et al. | |

FOREIGN PATENT DOCUMENTS

| | | | |
|---|---|---|---|
| JP | 06-322517 | * | 11/1994 |
| JP | 2002-053946 | * | 2/2002 |

OTHER PUBLICATIONS

Ramm et al "Thernal stabiloity of thin film corundum-type solid solutions of (Al(1-x)Cr(x))2)3 synthesized undet low temperature non-equilbrium conditions" Advance Engineering Materials 2007, 9, vol. 7 p. 604-608.*

Ramm et al "Pulse enhanced electron emission (P3eTM) arc evaporation and the synthesis of wear Al-Cr-O coatings in corundum structure" Surface & Coatings Techn 202 (2007) p. 876-883.*

(Continued)

*Primary Examiner* — Archene Turner
(74) *Attorney, Agent, or Firm* — Pearne & Gordon LLP (57) ABSTRACT

The present invention relates to a coating for workpieces with at least one layer, the at least one layer comprising metal components represented by AlxCr1−x wherein x is an atomic ratio meeting $0 \leq x \leq 0.84$ and comprising non metallic components represented by O1−yZy where Z is at least one Element selected from the group N, B, C and $0 \leq y \leq 0.65$, preferably $y \leq 0.5$ characterized in that the coating comprises at least partially a cubic non gamma Cr and oxide comprising phase in such a way that the x-ray diffraction pattern shows formation of cubic phase which is not the cubic phase of CrN.

4 Claims, 7 Drawing Sheets

(56) References Cited

OTHER PUBLICATIONS

Viktorov et al Fine structure of (aplha)Al2O3-based solid solutions Inorganic Materials, vol. 37, No. 10 (2001) p. 983-991.*

Witthaut et al "Preparation of Cr2O3-Al2O3 solid solutions by reactive magnetron sputtering" Mikrochim Acta 133 (200) p. 191-196.*
International Search Report for PCT/EP2009/007118 dated Dec. 4, 2009.

* cited by examiner

NON GAMMA-PHASE CUBIC ALCRO

This invention relates to a coating system based on physical vapor deposition (PVD) for the coating of workpieces, and to a method for fabricating corresponding coatings. The invention further relates to workpieces coated with said coating system.

STATE-OF-THE-ART

Employing of a wear resistant coating is a well known method for increasing the lifetime of a tool life. The coatings are in particularly helpful for improved surface hardness, hot hardness as well as for withstanding to abrasive and chemical wear. Additionally, oxidation resistance and thermal stability of the working surface can be improved significantly.

Because of their outstanding high temperature stability and chemical wear resistance $Al_2O_3$ coatings have been employed for many years for the protection of cutting tool surfaces. Nowadays commercially available $Al_2O_3$ coatings can be produced mostly by chemical vapour deposition (CVD) process at high temperature. For example, according to US 2004202877 the deposition of alpha-$Al_2O_3$ requires temperatures of between 950 and 1050° C. The utilization of the high deposition temperature restricts the choice of the substrate materials only to the special carbide grades. This, apart from the additional problem of an unavoidable concentration of undesirable decomposition products (such as halogens), constitutes the main drawback of the CVD coating process. Additionally CVD coatings are usually subject to tensile stress as a result of the different thermal expansion coefficients of the coating and the base material during the cooling-off of the high precipitation temperatures that are typical of the process. Since such stress leads to cracking fissuration, for instance ridge cracks, making these coatings less than suitable for machining processes such as interrupted cutting.

Alternatively $Al_2O_3$ coatings can be produced by physical vapour deposition (PVD) at lowered temperature.

EP 0513662 and U.S. Pat. No. 5,310,607 (Balzers) describe an $(Al,Cr)_2O_3$ hard-metal layer, a tool coated with it and a process for producing that layer whereby, from a crucible serving as the anode for a low voltage arc (LVA) discharge, Al and Cr powder is jointly vaporized and deposited on tools in an $Ar/O_2$ atmosphere at about 600° C. The coating exhibits residual compressive stress and consists essentially of mixed crystals with Cr content in excess of 5%, its thermodynamic stability enhanced by a high aluminum content, its abrasion resistance enhanced by an increased chromium concentration. The layer is referred to as a modified α-aluminum oxide (corundum) with a shift reflecting the chromium content. However, due to the insulating properties of these layers, their fabrication by the stated LVA technique entails process-related difficulties in continuous operation.

WO2008043606 (Balzers) describes the deposition of wear resistant coatings containing mixed-crystal layer $(Me1_{1-x}Me2_x)_2O_3$ where Me1 and Me2 each represent at least one of the elements Al, Cr, Fe, Li, Mg, Mn, Nb, Ti, Sb or V and the elements of Me1 and Me2 differ from one another. The layers exhibit a corundum structure. The coatings were produced by cathodic arc evaporation method. Produced coatings are believed to inherit the properties of the α-$Al_2O_3$ and therefore have outstanding thermal and oxidation resistance. Furthermore, utilized deposition procedure enables deposition of oxide layers undergo compressive stress. Additionally it is pointed out that the cathodic arc evaporation is very promising deposition method for producing of oxide or non conductive layers.

JP2008018503A (MMC) describes deposition of double layered structure consisting of nitride layer and composite oxide $(AlCr)_2O_3$ top layer. A composite oxide layer of Al and Cr satisfying a specific composition formula: $(Al_{1-Q}Cr_Q)_2O_3$ having an α-type crystal structure. It is claimed that the coating structure containing oxide layer provides outstanding cutting performance.

WO2004097062 (KOBE) describes a method whereby the growth of the aluminum oxide crystals is interrupted either at periodic intervals by thin oxide layers of different metal oxides which as well grow along a corundum structure, such as $Cr_2O_3$, $Fe_2O_3$, $(AlCr)_2O_3$, $(AlFe)_2O_3$, or at least by the periodic dispersion of such oxides. The layer regions encompassing those other metal oxides are supposed to be held at less than 10% and preferably even less than 2%. It would appear, however, that the long coating times involved in producing these layers, at about 5 hours for 2 μm, are hardly practical for industrial processes.

US2004121147 (KOBE) describes deposition of corundum type $Cr_2O_3$ $(AlCr)_2O_3$ and $(AlFe)_2O_3$ by means of unbalanced magnetron sputtering. The authors proposed formation of epitaxial template for growth of corundum type structure. The template was realized by means of oxidizing of nitride layer, for example TiAlN or AlCrN.

EP10990033 (Sandvik) describes utilization of dual magnetron sputtering for deposition of layer having spinel like structure and composition of type $Me_xAl_2O_{3+x}$ ($0 \leq x \leq 1$) where Me is formed of one or more of the metals of the group Mg, Zn, Mn, Fe, Co, Ni, Cd, Cu, Cr and Sn. It is pointed out that reactive working point for the process has to be optimized in order to get reasonable deposition rate. Furthermore, special design of the targets was utilized for deposition of multicomponent coatings.

US20040137281A1 (HITACHI TOOL ENGINEERING, LTD) Describes utilization of an arc-discharge ion-plating method for producing of the protective layers containing Al, Cr and Si in metallic component and N, B, C and O in non metallic component. Very broad range of the element concentrations as well as numerous combinations of the chemical compositions are claimed. However the oxygen concentration is claimed to be as lower as 25 at. % in non metallic component.

WO2007121954 (CEMECON AG) describes utilization of magnetron sputtering deposition procedure for producing of $(Al,Cr,Si)_2O_3$ layers with the oxygen concentration of more than 30 at. % in non metallic component. The authors claimed that the $(Al,Cr,Si)_2O_3$ layers having crystal structure of Fd3m space group which is formed through the substitution of Al by Cr in gamma-$Al_2O_3$. Although, the shown results of the X-ray analysis do not provide the information that crystals consisting of $(Al,Cr,Si)_2O_3$ were obtained. Furthermore, no chemical composition of the produced compound is provided, this fact makes very questionable formation of claimed layer structure. The authors also mentioned that up to 70% of oxygen in the coating has to be substituted by nitrogen in order to obtain sufficient hardness.

Although these prior art coatings show good wear protective performance, here is a great potential for further improvement. It is well known that the $Al_2O_3$ layers show lower hardness at room temperature as compared to conventional nitride layers such as TiAlN, AlCrN, TiCN. It can be also expected that $(Al, Cr)_2O_3$ layers inherit lower hardness of $Al_2O_3$. Additionally, utilization of magnetron sputtering method is very complicated due to very narrow process window and in combination with low deposition rate is not commercially feasible. On the other hand the cathodic arc evaporation provides stable deposition rate, but increased droplet emission from the target results in significantly rough coating surface. Furthermore, even during cathodic arc deposition of oxide layers the deposition rate is lower than for nitride layers.

OBJECTIVES OF THE ACTUAL INVENTION

It is therefore an object of present invention to disclose a wear resistant coating with increased lifetime of machining tools for a very broad range of applications, comprising continuous and interrupted cutting applications including but not limited to drilling, milling, reaming, turning, tapping, threading and hobbing applications.

Furthermore it is an object of the present invention to disclose coatings for workpieces for machining parts of various materials such as ferrous and non-ferrous metals as well as composite materials.

Furthermore it is an object of the present invention to disclose coatings and/or coated work pieces which may be used under various working conditions, such as for example dry cutting, cutting with emulsion and liquid coolants, cutting with minimal quantity lubrication (MQL) and cutting with gaseous coolants.

It is another object of present invention is to disclose a work piece, coated with said inventive coating. Said work piece machining tool is a drill, endmill, insert, hob. The work piece substrate may be steel, including but not limited to high-speed steel, cemented carbide, cubic boron nitride, cermet or a ceramic material.

In order to meet the objectives as mentioned above we propose a coating having such improved properties. Said coating comprising metal components represented by $Al_xCr_{1-x}$, wherein x is an atomic ratio meeting $0 \leq x \leq 1$, and non metallic component represented by $O_{1-y}(N,B,C)_y$, wherein y is an atomic ratio meeting $0 \leq y \leq 0.5$. The layer is characterized in that the crystal lattice of the mixed-crystal layer comprises a cubic structure and/or mixture of cubic and hexagonal. Said wear resistant is characterized especially by high wear resistance, thermal stability, oxidation resistance, hardness and hot hardness. Said wear resistant coating has a thickness of more than 0.1 μm and lower than 30 μm.

In addition to the $Al_xCr_{1-x}O$ mixed-crystal layer the layer system may comprise one or more intermediate layers, in particular a bonding layer and/or a hard-metal layer. This intermediate layer is positioned between the workpiece and the mixed-crystal layer. A cover layer can be deposited on the mixed-crystal layer. Intermediate layer and cover layer preferably contain one of the metals of sub-groups IV, V and VI of the periodic system and/or Al, Si, Fe, Ni, Co, Y, La or a mixture thereof. Layer The metals of the hard-metal layer and/or the cover layer are preferably compounded with at least one of N, C, O, B or mixtures thereof and the compound with N or CN is especially preferred.

In addition the following variations are for example possible:

A modulation of the Al/Cr ratio within the cubic-AlCrO—nanolayers may be realized through carousel rotation
AlCrO/Nitride multilayers may be deposited directly or onto support layer
A mixture of Cubic-AlCrO and hexagonal-AlCrO A further object of invention is to disclose a PVD process which can synthesize this layer combination not only in separate deposition processes but also within one deposition process. During such a process preferably a deposition temperature <650° C. and more preferred <550° C. is used and a gas atmosphere comprising predominantly diluting gas which is preferably N and reactive gas O with a total gas pressure situated between 0.5 and 10 Pa and a bias voltage of between 40 and 200V is used.

DETAILED DESCRIPTION OF THE INVENTIVE SOLUTION

In order to produce the coatings according to the present invention the workpieces were placed in appropriately provided double- or triple-rotatable holders. The holders were positioned in the vacuum processing chamber, whereupon the vacuum chamber was pumped down to a pressure of about $10^{-4}$ mbar.

For generating the process temperature, supported by radiation heaters, a low voltage arc (LVA) plasma was ignited between a baffle-separated cathode chamber, housing a hot cathode, and the anodic workpieces in an argon-hydrogen atmosphere.

The following heating parameters were selected:

| | |
|---|---|
| Discharge current (LVA) | 250 A |
| Argon flow | 50 sccm |
| Hydrogen flow | 300 sccm |
| Process pressure | 1.4 Pa |
| Substrate temperature | approx. 550° C. |
| Process duration | 45 min |

Those skilled in the art will be familiar with possible alternatives. As a matter of preference the substrate was connected as the anode for the low voltage arc and also preferably pulsed in unipolar or bipolar fashion.

As the next procedural step the etching was initiated by activating the low voltage arc between the filament and the auxiliary anode. Here as well, a DC-, pulsed DC- or AC-operated MF or RF power supply can be connected between the workpieces and frame ground. By preference, however, a negative bias voltage was applied to the workpieces.

The following etching parameters were selected:

| | |
|---|---|
| Argon flow | 60 sccm |
| Process pressure | 0.24 Pa |
| Discharge current, LVA | 150 A |
| Substrate temperature | approx. 550° C. |
| Process duration | 10-60 min |
| Bias | 200-250 V |

The next procedural step consisted in the coating of the substrate with a TiN interface layer.

For the deposition of the TiN interface layer the following parameters were selected:

| | |
|---|---|
| Argon flow | 0 sccm (no argon added) |
| Nitrogen flow | Pressure-regulated to 0.8 Pa |
| Process pressure | 0.8 Pa |
| DC source current Ti | 160 A |
| Coil current of the source | 1 A |
| DC substrate bias | U = −100 V |
| Substrate temperature | approx. 550° C. |
| Process duration | 10 min |

Note that if higher ionization is needed, all coating processes can be assisted by means of the low voltage arc plasma.

The coating of the substrate with the actual functional layer took place in either pure nitrogen or mixture of nitrogen and oxygen. Since oxide coating constitutes an insulating layer, either a pulsed or an AC bias supply was used.

The key functional-layer parameters were selected as follows:

| | |
|---|---|
| Oxygen flow | 0-600 sccm |
| Nitrogen flow | Pressure-regulated to 3.5 Pa |
| Process pressure | 3.5 Pa |
| DC source current, Al—Cr | 180-200 A |
| Coil current of the source | 0.5-1 A |
| Substrate bias | U = 60 V |
| | (bipolar, 36 μs negative, 4 μs positive) |
| Substrate temperature | approx. 550° C. |
| Process duration | 150 min |

The test examples #1.1 to #4.5 shown in Table 1 refer to simple layer systems according to the invention, each consisting of an oxide layer of the $(Al_{1-x}Cr_x)O$ type produced in composition range $0 \leq x \leq 0.85$ and coated on a TiN interlayer. The remaining parameters were identical to the parameters described above for producing the functional layer.

Figure 1:
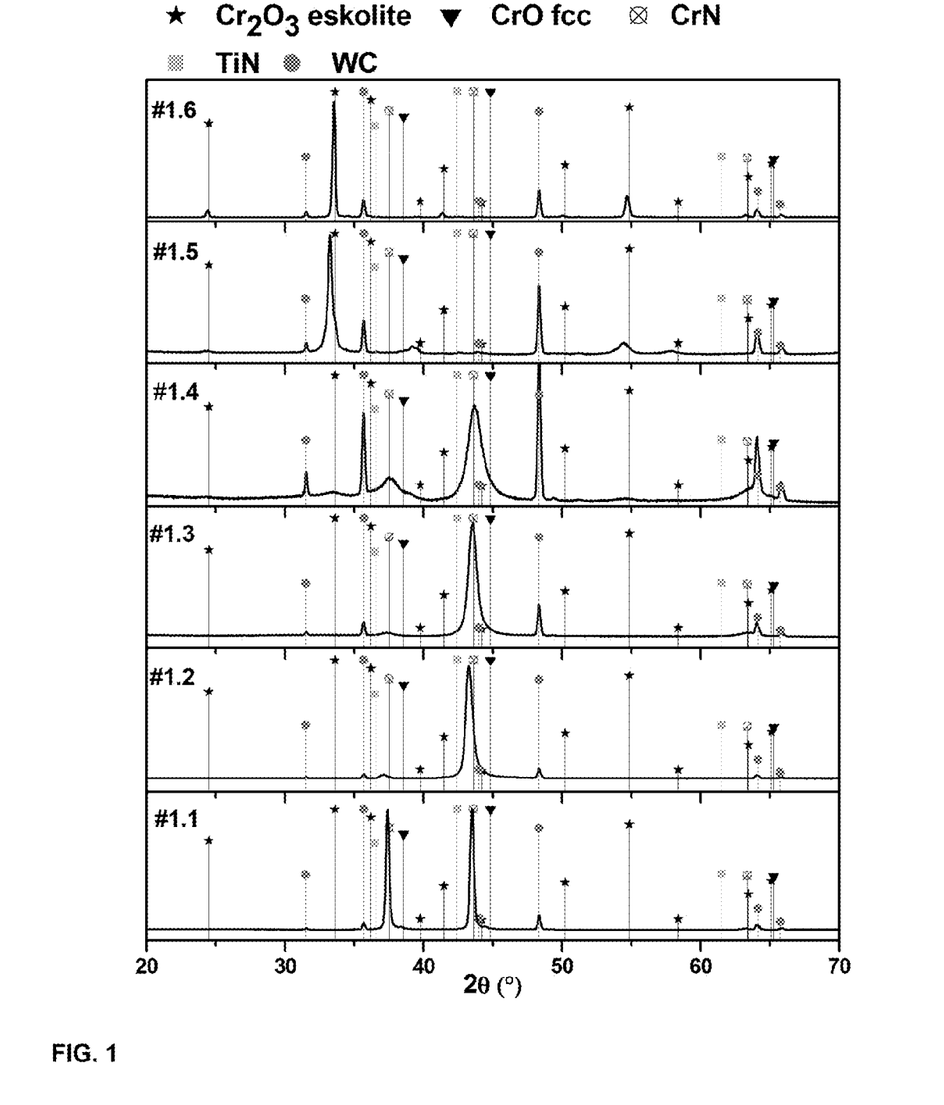
FIG. 1 X-ray diffraction pattern of the coatings #1.1-#1.6 deposited using Cr targets and different oxygen flows FIG. 2 X-ray diffraction pattern of the coatings #2.1-#2.6 deposited using AlCr (50/50) targets and different oxygen flows FIG. 3 X-ray diffraction pattern of the coatings #3.1-#3.6 deposited using AlCr (70/30) targets and different oxygen flows FIG. 4 X-ray diffraction pattern of the coatings #4.1-#4.5 deposited using AlCr (85/15) targets and different oxygen flows FIG. 5 Cross-sectional SEM pictures of a) coating #2.3 and b) coating #2.6

FIG. 1 shows x-ray diffraction pattern of the coatings #1.1-1.6 deposited using Cr targets. It can be seen that the coating #1.1 deposited in pure nitrogen atmosphere exhibits CrN structure. Additionally the substrates reflexes can be identified. If some oxygen is added, the reflex at about 43.6° is slightly shifted to lower angles. This might relate to internal stress when oxygen is incorporated into the lattice. The coatings #1.2-#1.4 deposited with further addition of oxygen to the reactive gas, show as well a texture change where reflex at the 2θ position of about 43.6° is mostly pronounced. In order to identify the position of the reflex, the both half maximum values are connected by a straight line. The middle of this straight line can be regarded as position of the reflex. From figures #1.2 to #1.4 the reflex at about 43.6° shows a shift to the higher angle positions with increased oxygen content. As can be seen from the figure for coatings #1.5 and #1.6 the reflex at about 43.6° completely disappears and the spectra show clear eskolite structure with predominant texture. The chemical composition as measured by means of Rutherford backscattered spectroscopy (RBS) for coatings #1.1-#1.6 is shown in Table 1. The coating #1.1 show clear formation of stoichiometrical CrN. The coatings #1.2-#1.4 show continuous substitution of nitrogen with oxygen in the coating composition. The coating #1.4 deposited at the oxygen flow of 130 sccm show formation of an oxygen rich composition. Coating #1.4 comprises almost three times less nitrogen than oxygen. Since the coating #1.4 shows only low concentration of nitrogen and high concentration of oxygen and the x-ray diffraction pattern shows formation of cubic phase which shifts in direction of the cubic-CrO if more nitrogen is substituted by oxygen, we concluded that at least partially cubic CrO is formed.

Figure 2:
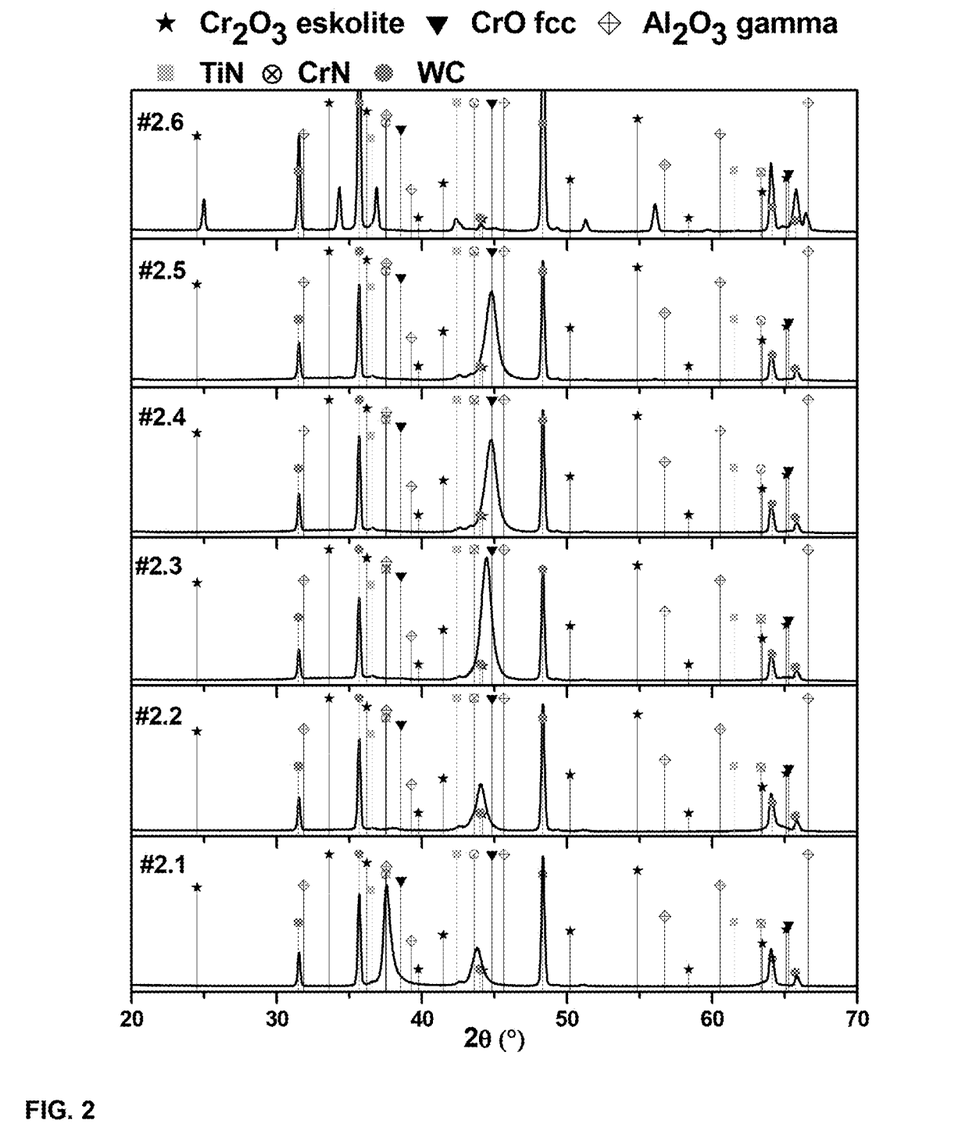

FIG. 2 shows x-ray diffraction patterns for coatings #2.1-#2.6 deposited using AlCr (50/50) targets and oxygen flow varied from 0 to 400 sccm. All x-ray diffraction patterns which are shown in FIG. 2 exhibit reflexes of the WC-substrate and the TiN interlayer. The coating #2.1 deposited in pure nitrogen atmosphere show formation of cubic-AlCrN. The cubic-AlCrN can be identified by two cubic-CrN reflexes at 2θ positions of about 37.5° and 43.6°. The slight peak shift to the higher 2θ angles can be assigned to the incorporation of Al into cubic-CrN lattice. This is in line with the results of RBS measurements listed in Table 1, where only nitrogen and no oxygen was measured within the coating. The coatings #2.2-#2.5 were deposited with an oxygen flow which was increased from 100 sccm (#2.2) to 200 sccm (#2.5). The respective coatings show a very pronounced reflex at the 2θ position of about 43.6°. The reflex is getting more pronounced at if the oxygen flow increases from 100 to 150 sccm. The reflex intensity decreases if the oxygen flow increases further from 150 to 200 sccm. Furthermore the reflex position changes continuously from cubic-AlCrN to cubic-CrO if the oxygen flow increases. As can be seen form Table 1 the coating #2.3 deposited at oxygen flow 150 sccm has high oxygen content and low nitrogen content. Moreover the coatings #2.4 and #2.5 show presence of only oxygen as non metallic part. The results of the chemical analysis in combination with x-ray diffraction confirm formation of the oxide with cubic structure. At least five reflexes of $Cr_2O_3$ with hexagonal type structure can be identified on the x-ray diffraction pattern of coating #2.6 deposited at oxygen flow of 400 sccm. This result correlates well with the chemical composition of the coating where only oxygen was detected in the non metallic component.

Figure 3:
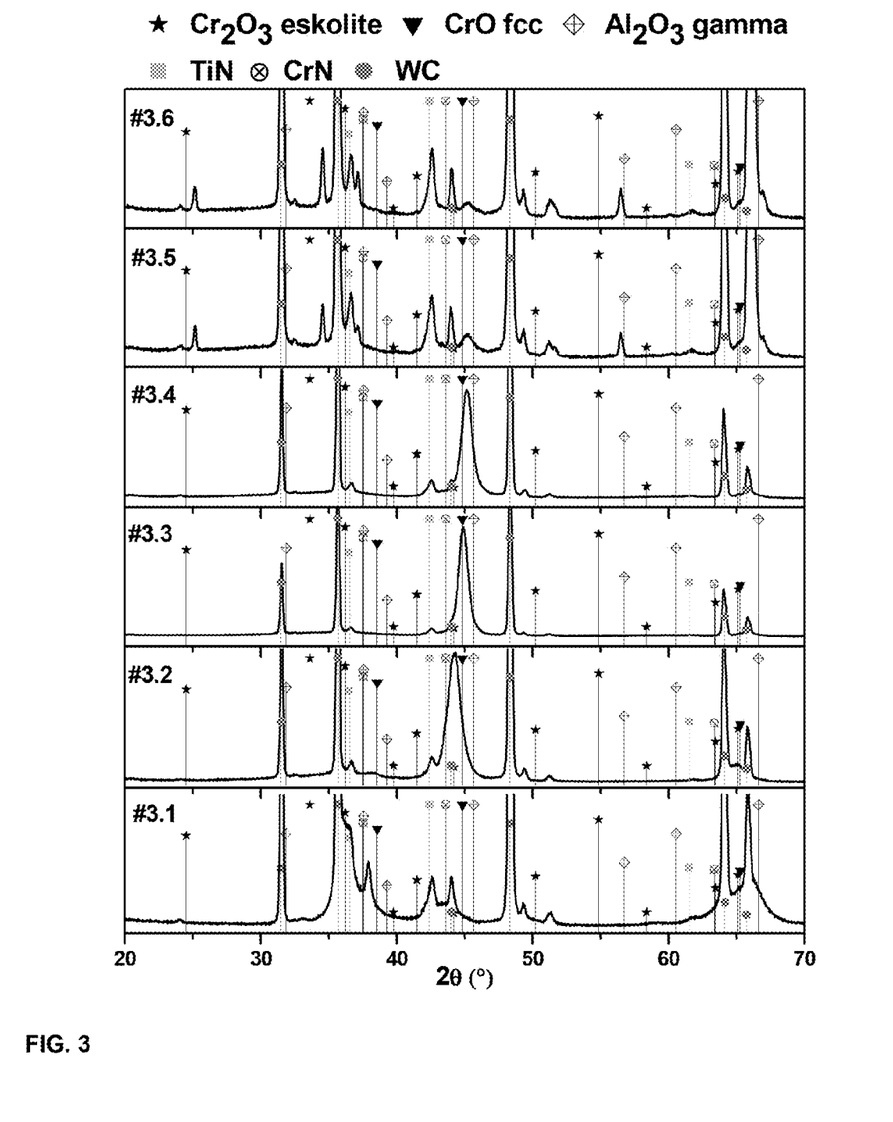

FIG. 3 shows x-ray diffraction patterns for coatings #3.1-#3.6 deposited using AlCr (70/30) targets and oxygen flow varied from 0 to 600 sccm. All x-ray diffraction patterns which are shown in FIG. 3 exhibit reflexes of the WC substrate and the TiN interlayer. The coating #3.1 deposited in pure nitrogen atmosphere shows formation of cubic-AlCrN. As already discussed, the cubic-AlCrN can be identified by two cubic-CrN reflexes at 2θ positions of about 37.5° and 43.6°. The slight peak shift to the higher 2θ angles can be assigned to the incorporation of Al into cubic-CrN lattice. Introduction of the oxygen into reactive gas atmosphere resulted in the formation of the oxide layers #3.2-#3.4 with cubic structure. At oxygen flows of 400 and 600 sccm the oxide layers #3.5 and #3.6 show hexagonal structure. Furthermore the x-ray diffraction patterns of #3.5 and #3.6 show weak reflexes at 2θ position of about 45° and 67° which may belong to gamma $Al_2O_3$.

Figure 4:
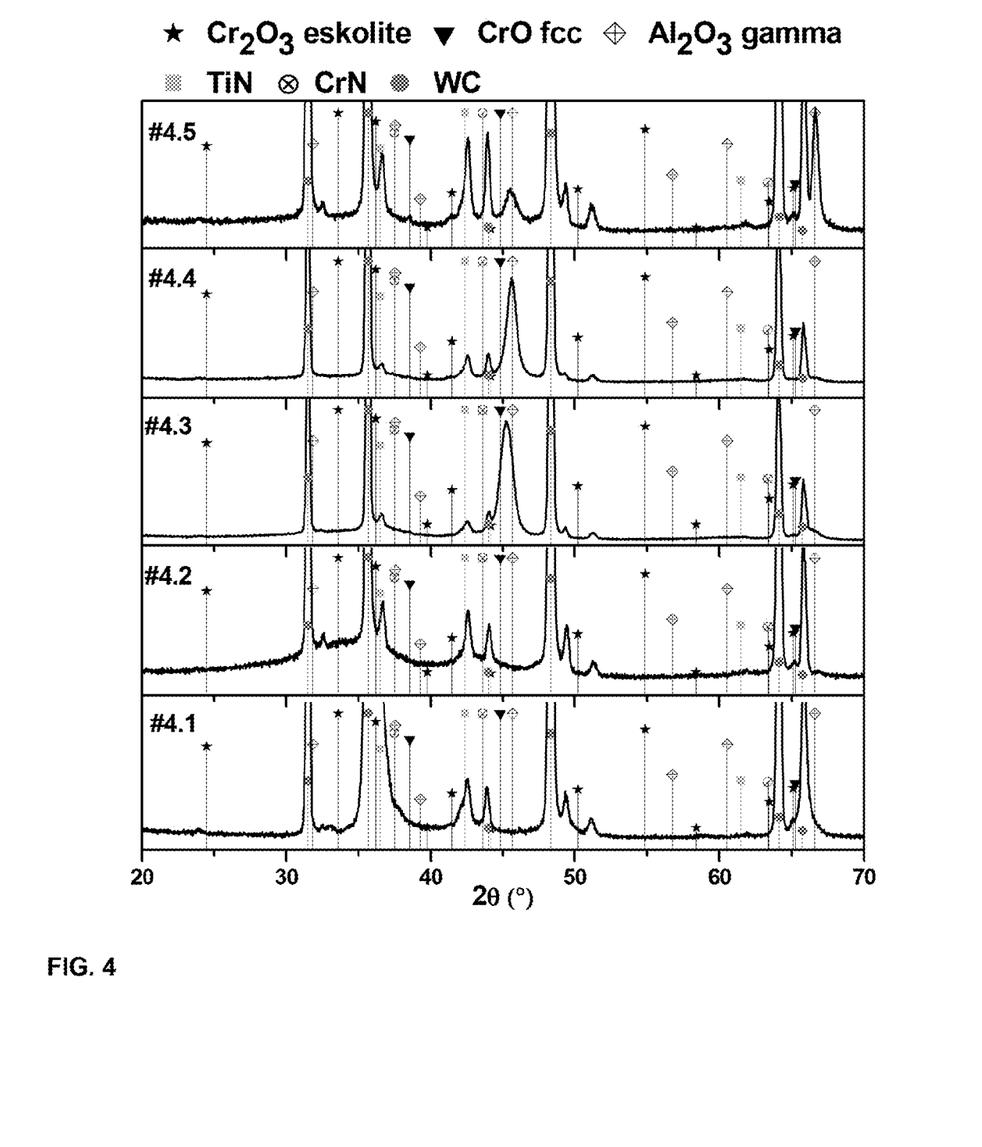

FIG. 4 shows x-ray diffraction patterns for coatings #4.1-#4.5 deposited using AlCr (85/15) targets and oxygen flow varied from 0 to 400 sccm. All x-ray diffraction patterns which are shown in FIG. 4 exhibit reflexes of the WC substrate and TiN interlayer. The coating #4.1 deposited in pure nitrogen atmosphere exhibit amorphous structure without any reflexes from the functional layer. Mostly the same structure can be observed for coating #4.2 which was deposited at oxygen flow of 100 sccm. Coatings #4.3 and #4.4 which contain mostly oxygen in the non metallic component show formation of cubic structure. At oxygen flow of 400 sccm formation of only gamma $Al_2O_3$ can be observed.

The results listed above confirm formation of oxide coating with cubic structure like CrO but not like gamma $Al_2O_3$ at certain oxygen flow and in very broad compositional range. The oxide coatings with cubic structure can be produced even at high Al contents where growth of hexagonal phase is not possible.

Figure 5:
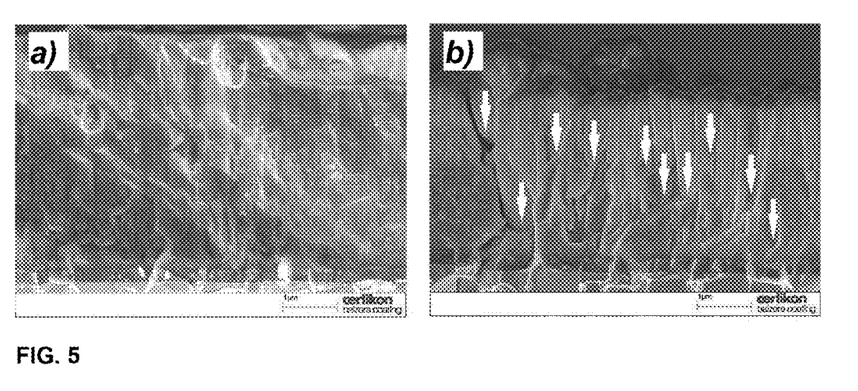

FIG. 5 shows the SEM cross-sectional pictures of coating #2.3 (FIG. 5a) with cubic structure and coating #2.6 with hexagonal structure (FIG. 5b). It can be observed that the coating #2.3 (FIG. 5a) has dense structure without pronounced droplets, however coating #2.6 (FIG. 5b) exhibits many coarse droplets (marked with arrows). The incorporated droplets in the coating #2.6 result in rougher surface as compared to coating #2.3. This is one of the reasons, why it is beneficial to produce oxide coatings with cubic structure.

Figure 8:
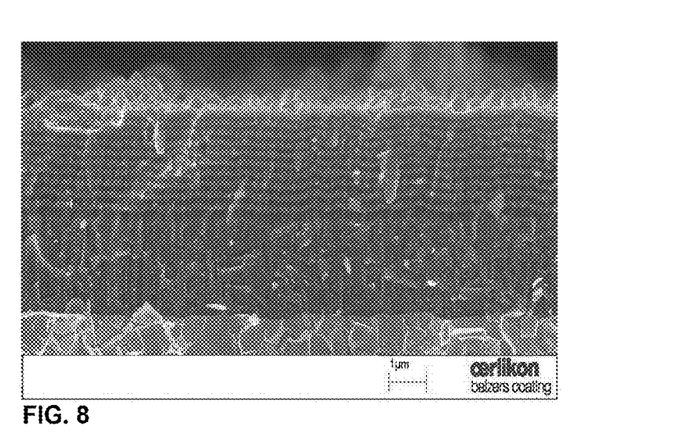

In order to investigate the thermal stability of the coatings annealing experiments were performed. The samples were heated up to 1000° C. during 25 minutes and kept in the oven for 60 minutes. Heating and annealing was performed in nitrogen atmosphere. The structure changes due to annealing were detected by means of x-ray diffraction FIG. 8a and FIG. 8b show x-ray diffraction patterns of coating #4.5 a) after and b) before annealing. As can be seen there is a dramatic change in the diffraction pattern after annealing: Our explanation is that the coating #4.5 with (cubic) gamma structure before annealing shows formation of hexagonal phase after annealing. This is not very astonishing as gamma-phase structures are know to transform to alpha phase structures under annealing conditions.

Figure 6:
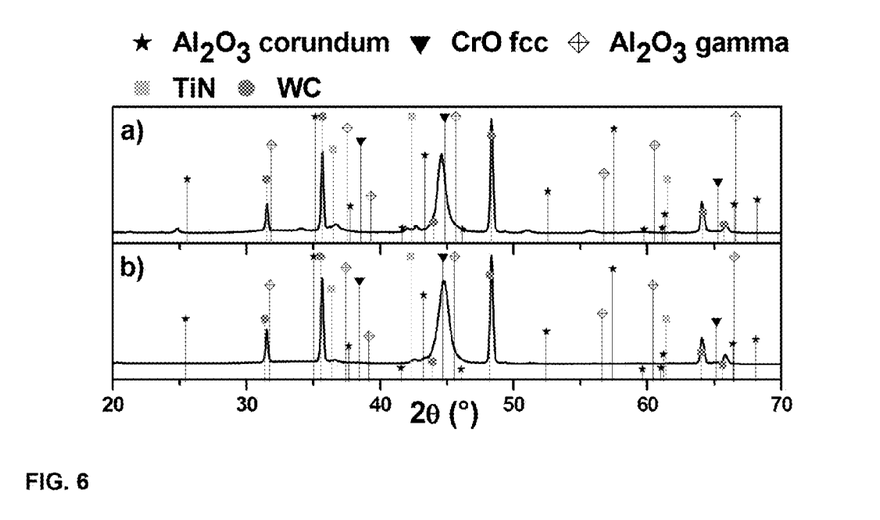
FIG. 6 X-ray diffraction patterns of a) coating #2.4 after annealing at 1000° C. in N2-atmosphere during 60 minutes, b) coating #2.4 as deposited FIG. 7 X-ray diffraction patterns of a) coating #3.3 after annealing at 1000° C. in N2-atmosphere during 60 minutes, b) coating #3.3 as deposited FIG. 8 X-ray diffraction patterns of a) coating #4.5 after annealing at 1000° C. in N2-atmosphere during 60 minutes, b) coating #4.5 as deposited, c) coating #4.2 after annealing at 1000° C. in N2-atmosphere during 60 minutes, d) coating #4.2 as deposited FIG. 9 Example of coating structure containing supporting nitride layer and nitride/oxide multilayers
Figure 7:
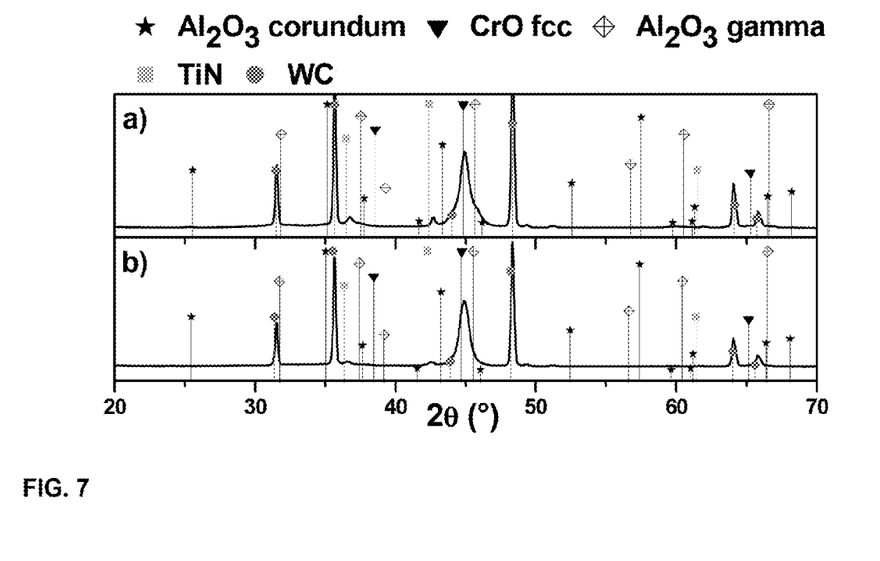

FIG. 8c and FIG. 8d show x-ray diffraction patterns of coating #4.2 c) after and d) before annealing. The coating #4.2 with cubic structure shows no considerable changes in the crystal structure as the x-ray diffraction pattern essentially did not change. In conclusion, the predominant cubic structure of #4.2 is not a gamma-phase structure. Same behavior was observed for all other coatings as shown in FIG. 6 and FIG. 7

Deposition rate for Al—Cr—O—N coatings as a function of oxygen flow is listed in Table 2. It can be clearly seen, that independent on the target composition the highest deposition rate can be achieved at the oxygen flow which corresponds formation of oxide layer with cubic structure. The higher deposition rate of the oxide layers with non gamma phase cubic structures is extremely beneficial for industrial production process due to reduced time consumption and therefore increased productivity.

It was observed (see Table 2) that the hardness of the Al—Cr—O—N coatings with non gamma phase cubic structure is higher than for the coatings with hexagonal or gamma like structure. Moreover, the hardness of the oxide coatings with cubic structure is even higher or comparable to that of nitride coatings.

The results of the cutting tests using Al—Cr—O—N coatings are summarized in Table 2.
Cutting conditions:
  Work piece: DIN 1.7220 (200-220 HB)
  Cutting tool: Cemented carbide cutting insert CNMG120408
  Cutting speed: 200 m/min
  Feed rate: 0.15 mm/revolt
  Depth of cut: 3 mm
  Coolant: dry
  Cutting operation: outside turning
  End of lifetime: wear measurement after one minute of cutting: criterion
    for end of lifetime $VB_{max}$>200 um As can be seen from the last 4 columns of Table 2 the inventive coatings show significantly higher cutting performance as compared to the pure nitride layers as well as compared to oxide layers with hexagonal or gamma structure.

Figure 9:
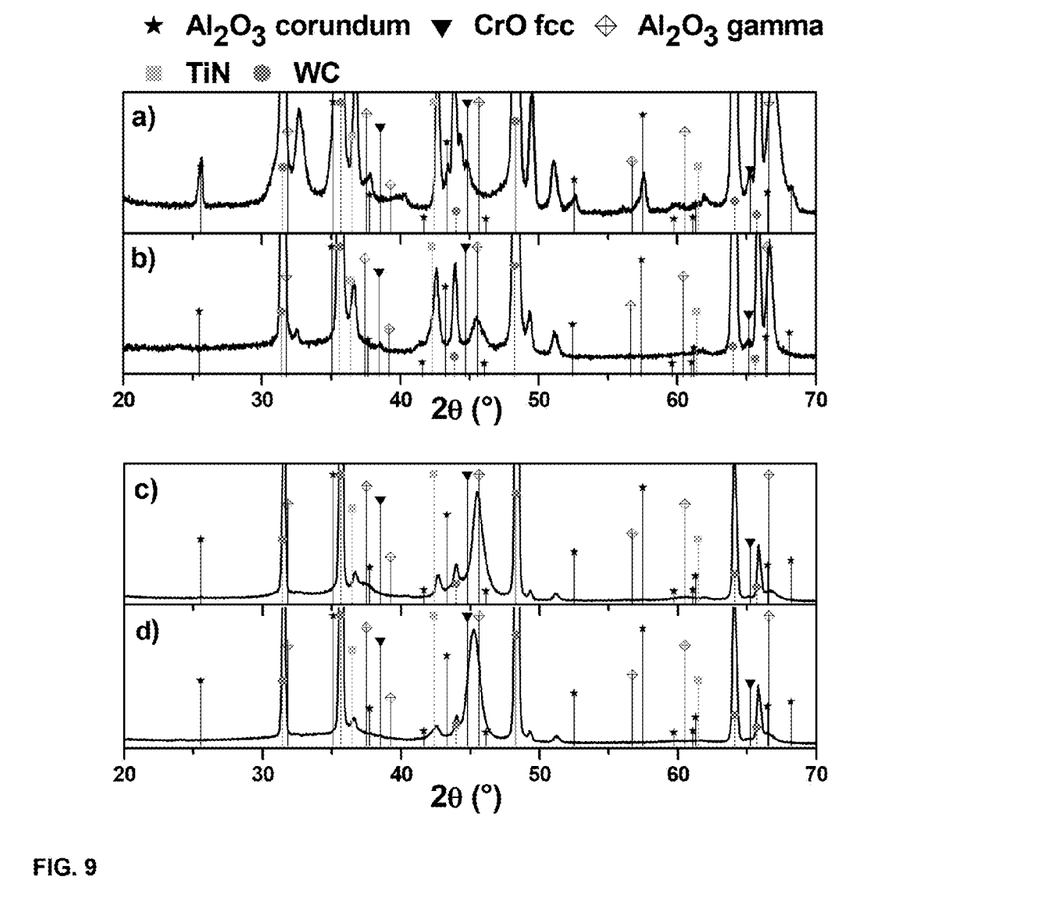

It has to be mentioned that for purpose of broadening of the application range of the inventive layer, the coating structure may include for example support layer as well as multilayer structure comprising cubic oxide and nitride layers. The example is shown in FIG. 9.

A coating for workpieces was disclosed with at least one layer, the at least one layer comprising metal components represented by AlxCr1−x wherein x is an atomic ratio meeting 0≦x≦0.84 and comprising non metallic components represented by O1−yZy where Z is at least one Element selected from the group N, B, C and 0≦y≦0.65, preferably y≦0.5 characterized in that the coating comprises at least partially a cubic non gamma Cr and Oxide comprising phase in such a way that the x-ray diffraction pattern shows formation of cubic phase which is not the cubic phase of CrN.

Preferably the above mentioned coating for workpieces is characterized in that x≧0.5

Preferably their x-ray diffraction pattern essentially does not show changes after annealing up to 1000° C. during 25 minutes as compared to before annealing.

A coated body with a coating according to the above mentioned coating was is disclosed. Preferably for this coated body an additional layer, preferably a TiN layer is provided between the coating and the surface of the body The above mentioned coated body may be a tool preferably selected from the group of drills, endmills, inserts and hobs, taps, saw blades.

A method for coating bodies was disclosed said method comprising the steps of
providing a body or bodies to be coated
introducing the body or bodies into an arc discharge ion-plating coating system with a target of the composition AlaCr1−a where 0≦a≦0.85.
performing the arc discharge ion plating in such a way that at least one process step comprises an oxygen flow between 50 sccm and 400 sccm, preferably between 100 sccm and 400 sccm, more preferred between 150 sccm and 200 sccm.

Preferably at least one process step in the above mentioned method comprises a nitrogen flow in such a way that the pressure is regulated to 3.5 Pa.

Preferably no argon is added as process gas.

TABLE 1

| Target | | | Stoichiometrical coefficients | | | |
|---|---|---|---|---|---|---|
| ID | composition | Nr. of targets | Oxygen flow (sccm) | Al | Cr | O | N |
| 1.1 | Cr | 4 | 0 | 0 | 2 | 0 | 1.9 |
| 1.2 | Cr | 4 | 50 | 0 | 2 | 0.3 | 1.7 |
| 1.3 | Cr | 4 | 100 | 0 | 2 | 1.2 | 1.3 |
| 1.4 | Cr | 4 | 130 | 0 | 2 | 1.95 | 0.7 |
| 1.5 | Cr | 4 | 150 | 0 | 2 | 2.65 | 0 |
| 1.6 | Cr | 4 | 200 | 0 | 2 | 2.9 | 0 |
| 2.1 | AlCr(50/50) | 2 | 0 | 0.91 | 1.04 | 0 | 1.75 |

TABLE 1-continued

|  | Target | Nr. of | Oxygen | Stoichiometrical coefficients | | | |
|---|---|---|---|---|---|---|---|
| ID | composition | targets | flow (sccm) | Al | Cr | O | N |
| 2.2 | AlCr(50/50) | 2 | 100 | 0.93 | 1.07 | 1 | 1.1 |
| 2.3 | AlCr(50/50) | 2 | 150 | 0.97 | 1.03 | 2.4 | 0.45 |
| 2.4 | AlCr(50/50) | 2 | 180 | 0.95 | 1.05 | 2.8 | 0 |
| 2.5 | AlCr(50/50) | 2 | 200 | 0.96 | 1.04 | 2.85 | 0 |
| 2.6 | AlCr(50/50) | 2 | 400 | 1 | 1 | 3 | 0 |
| 3.1 | AlCr(70/30) | 2 | 0 | 1.34 | 0.66 | 0 | 1.8 |
| 3.2 | AlCr(70/30) | 2 | 100 | 1.34 | 0.66 | 1.35 | 1.1 |
| 3.3 | AlCr(70/30) | 2 | 150 | 1.37 | 0.63 | 2.65 | 0 |
| 3.4 | AlCr(70/30) | 2 | 200 | 1.35 | 0.65 | 2.85 | 0 |
| 3.5 | AlCr(70/30) | 2 | 400 | 1.39 | 0.61 | 2.8 | 0 |
| 3.6 | AlCr(70/30) | 2 | 600 | 1.37 | 0.63 | 2.7 | 0 |
| 4.1 | AlCr(85/15) | 2 | 0 | 1.65 | 0.35 | 0 | 1.95 |
| 4.2 | AlCr(85/15) | 2 | 100 | 1.64 | 0.36 | 1.7 | 0.9 |
| 4.3 | AlCr(85/15) | 2 | 150 | 1.66 | 0.34 | 2.75 | 0.2 |
| 4.4 | AlCr(85/15) | 2 | 200 | 1.67 | 0.33 | 2.65 | 0.15 |
| 4.5 | AlCr(85/15) | 2 | 400 | 1.68 | 0.32 | 2.65 | 0.1 |

TABLE 2

| ID | Deposition rate (nm/min) | Hardness (GPa) | Tool life time (min) |
|---|---|---|---|
| 1.1 | 29.8 | 22.3 | 1 |
| 1.2 | 29.8 | 34.2 | 1 |
| 1.3 | 33.3 | 33.8 | 1 |
| 1.4 | 35.3 | 35.4 | 1 |
| 1.5 | 35.3 | 30.2 | 1 |
| 1.6 | 27 | 29.8 | 1 |
| 2.1 | 23.9 | 35.7 | 2 |
| 2.2 | 29.7 | 43.2 | 3 |
| 2.3 | 27 | 35.8 | 6 |
| 2.4 | 25.2 | 34.4 | 6 |
| 2.5 | 27.7 | 31.9 | 5 |
| 2.6 | 20.7 | 28.1 | 5 |
| 3.1 | 24.5 | 36.9 | 2 |
| 3.2 | 27.5 | 45.3 | 4 |
| 3.3 | 26.1 | 35.1 | 6 |
| 3.4 | 23.4 | 31.1 | 6 |
| 3.5 | 16.7 | 29.2 | 5 |
| 3.6 | 16 | 28.6 | 5 |
| 4.1 | 23 | 27.8 | 1 |
| 4.2 | 23 | 23 | 3 |
| 4.3 | 28 | 31.3 | 7 |
| 4.4 | 16 | 28.9 | 6 |
| 4.5 | 15 | 24.5 | 6 |

The invention claimed is:

1. A method for coating bodies, the method comprising the steps of:
providing a body or bodies to be coated;
introducing the body or bodies into an arc discharge ion-plating coating system with a target of the composition $Al_aCr_{1-a}$ where $0 \leq a \leq 0.85$; and
performing the arc discharge ion plating in such a way that at least one process step comprises an oxygen flow between 50 sccm and 400 sccm and a nitrogen flow in such a way that a pressure is regulated to 3.5 Pa.

2. The method according to claim 1 characterized in that no argon is added as process gas.

3. The method according to claim 1 characterized in that the oxygen flow is between 100 sccm and 400 sccm.

4. The method according to claim 3 characterized in that the oxygen flow is between 150 sccm and 200 sccm.

* * * * *